United States Patent
Ihara

(10) Patent No.: US 9,318,521 B2
(45) Date of Patent: Apr. 19, 2016

(54) IMAGE SENSOR

(71) Applicant: Samsung Electronics Co., Ltd., Suwon-si (KR)

(72) Inventor: Hisanori Ihara, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/222,915

(22) Filed: Mar. 24, 2014

(65) Prior Publication Data

US 2014/0312391 A1    Oct. 23, 2014

(30) Foreign Application Priority Data

Apr. 23, 2013 (KR) .................. 10-2013-0045027

(51) Int. Cl.
*H01L 27/148* (2006.01)
*H01L 27/146* (2006.01)

(52) U.S. Cl.
CPC ..... *H01L 27/14614* (2013.01); *H01L 27/14647* (2013.01)

(58) Field of Classification Search
CPC ............. H01L 27/1461; H01L 27/14612; H01L 274/14614; H01L 27/14621; H01L 27/14627; H01L 27/14647; H01L 27/14689
USPC ......... 257/229, 291–292, 462, 243, 442, 230, 257/215; 438/59, 57, 200, 246
See application file for complete search history.

(56) References Cited

U.S. PATENT DOCUMENTS

| 7,405,437 | B2 | 7/2008 | Shim et al. | |
|---|---|---|---|---|
| 2004/0253761 | A1* | 12/2004 | Rhodes | H01L 27/14601 438/84 |
| 2006/0124976 | A1* | 6/2006 | Adkisson | H01L 27/14601 257/292 |
| 2007/0045679 | A1* | 3/2007 | McKee | H01L 27/14603 257/291 |
| 2008/0121952 | A1 | 5/2008 | Chu | |
| 2009/0166684 | A1* | 7/2009 | Yahav | H01L 27/14609 257/225 |
| 2009/0303371 | A1 | 12/2009 | Watanabe et al. | |
| 2010/0045836 | A1 | 2/2010 | Lee et al. | |
| 2011/0084322 | A1 | 4/2011 | Kang | |
| 2011/0089311 | A1 | 4/2011 | Venezia et al. | |
| 2011/0108897 | A1* | 5/2011 | Koo | H01L 27/14609 257/292 |
| 2012/0043589 | A1* | 2/2012 | Nozaki | H01L 27/14603 257/225 |
| 2012/0295386 | A1* | 11/2012 | Hynecek | H01L 27/14603 438/57 |

FOREIGN PATENT DOCUMENTS

| JP | 2011159757 | 8/2011 |
|---|---|---|
| KR | 100905230 | 6/2009 |
| KR | 101016552 | 2/2011 |
| KR | 2011070075 | 6/2011 |

* cited by examiner

*Primary Examiner* — Mohammed Shamsuzzaman
(74) *Attorney, Agent, or Firm* — Onello & Mello, LLP

(57) ABSTRACT

An image sensor includes a first sub-gate in a recessed region in a substrate; a second sub-gate on the first sub-gate in contact with an upper surface of the substrate; and an element isolation region in the substrate spaced apart from the first sub-gate. A lower surface of the second sub-gate is wider than an upper surface of the first sub-gate, and a portion of the element isolation region is spaced apart from the second sub-gate by a first distance in a first direction.

8 Claims, 19 Drawing Sheets

IMAGE SENSOR

CROSS-REFERENCE TO RELATED APPLICATION

This application claims priority from Korean Patent Application No. 10-2013-0045027 filed on Apr. 23, 2013 in the Korean Intellectual Property Office, and all the benefits accruing therefrom under 35 U.S.C. 119, the contents of which in their entirety are herein incorporated by reference.

BACKGROUND

1. Technical Field

The present inventive concepts relate to an image sensor.

2. Description of the Related Art

An image sensor is a semiconductor device that converts an optical image into an electrical signal. That is, the image sensor is a semiconductor device that converts electric charge, received as a light signal and converted into a voltage signal, to pixels that are displayed on an image. In general, contemporary image sensors may be classified as charge coupled device (CCD) image sensors and complementary metal oxide semiconductor (CMOS) image sensors.

With the continued advancement of computer and communication technologies, CMOS image sensors have come to enjoy widespread use in various fields such as digital cameras, camcorders, game players, security cameras, medical micro cameras, and robots. As CMOS image sensors continue to become more highly integrated and miniaturized, the size of a pixel serving as a unit to represent imaged information continues to become further reduced.

A unit pixel of a contemporary CMOS image sensor commonly includes a photoelectric conversion unit and a charge transfer unit. The charge transfer unit transfers electric charge generated by photoelectric conversion performed on incident light in the photoelectric conversion unit, to a charge detection unit. Meanwhile, the CMOS image sensor includes an active pixel region and an optical black region. The active pixel region receives incident light and converts the incident light into an electrical signal. The optical black region blocks inflow of light and thus provides a reference of a black signal, representing the absence of light, to the active pixel region.

SUMMARY

The present inventive concepts provide an image sensor formed by shifting an element isolation region from a gate in order to increase electrical potential in a CMOS image sensor.

The objects of the present inventive concepts are not limited thereto, and other objects of the present inventive concepts will be described in, or be apparent from, the following description of embodiments.

In an aspect, an image sensor comprises: a first sub-gate in a recessed region in a substrate; a second sub-gate on the first sub-gate in contact with an upper surface of the substrate; and an element isolation region in the substrate spaced apart from the first sub-gate, wherein a lower surface of the second sub-gate is wider than an upper surface of the first sub-gate, and wherein a portion of the element isolation region is spaced apart from the second sub-gate by a first distance in a first direction.

In some embodiments, the first distance ranges between about 0.02 µm to about 0.4 µm.

In some embodiments, a portion of the element isolation region extends to a central position of a pixel area of a photoelectric conversion element.

In some embodiments, a portion of the element isolation region is spaced apart from the second sub-gate by a second distance in a second direction that is different than the first direction.

In some embodiments, the image sensor further comprises a floating diffusion region positioned between the first sub-gate and the element isolation region.

In some embodiments, the image sensor further comprises photoelectric conversion elements formed in the substrate, the photoelectric conversion elements being spaced apart from the floating diffusion region.

In some embodiments, the photoelectric conversion elements include a first photoelectric conversion element and a second photoelectric conversion element, and the second photoelectric conversion element is formed in a deeper region than the first photoelectric conversion element.

In some embodiments, the element isolation region includes an element isolation impurity region and an element isolation film, wherein the element isolation impurity region is in the substrate, and the element isolation film is formed in or on the substrate.

In some embodiments, the element isolation region includes an element isolation impurity region, and is absent an element isolation film, wherein the element isolation impurity region is in the substrate.

In some embodiments, the element isolation region comprises a shallow trench isolation (STI) or deep trench isolation (DTI) structure.

In an aspect, an image sensor comprises: a first sub-gate in a recessed region in a substrate; a second sub-gate on the first sub-gate and in contact with an upper surface of the substrate; and an element isolation impurity region and an element isolation film in the substrate and spaced apart from the first sub-gate, wherein a lower surface of the second sub-gate is wider than an upper surface of the first sub-gate, wherein a portion of the element isolation impurity region is spaced apart from the second sub-gate by a first distance in a first direction, wherein a portion of the element isolation film is spaced apart from the second sub-gate by a second distance in a second direction that is different than the first direction, and wherein the first distance is greater than the second distance.

In some embodiments, the first distance is about 0.4 µm, and the second distance is about 0.02 µm.

In some embodiments, the image sensor further comprises a floating diffusion region positioned between the first sub-gate and the element isolation film.

In some embodiments, the image sensor further comprises photoelectric conversion elements formed in the substrate, the photoelectric conversion elements being spaced apart from the floating diffusion region.

In some embodiments, the photoelectric conversion elements include a first photoelectric conversion element and a second photoelectric conversion element, and the second photoelectric conversion element is formed in a deeper region than the first photoelectric conversion element.

In an aspect, an image sensor comprises: a first sub-gate in a recessed region of a substrate; a second sub-gate on the first sub-gate; an element isolation region in the substrate, a portion of the element isolation region being spaced apart from the first sub-gate in a first horizontal direction; and an active region positioned between the element isolation region and the first sub-gate; wherein a lower surface of the second sub-gate is wider than an upper surface of the first sub-gate, and wherein a portion of the element isolation region is spaced apart from the second sub-gate in the first direction, the active region extending in the first direction beyond the second sub-gate.

In some embodiments, a portion of the element isolation region is further spaced apart from the first sub-gate in a second horizontal direction that is orthogonal to the first horizontal direction and is spaced apart from the second sub-gate in the second horizontal direction, the active region further extending in the second direction beyond the second sub-gate.

In some embodiments, the portion of the element isolation region is spaced apart from the second sub-gate in the first direction by a first distance that ranges between about 0.02 μm to about 0.4 μm.

In some embodiments, a portion of the element isolation region extends to a central position of a pixel area of a photoelectric conversion element.

In some embodiments, the second sub gate contacts an upper surface of the substrate.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF EMBODIMENTS

Figure 1:
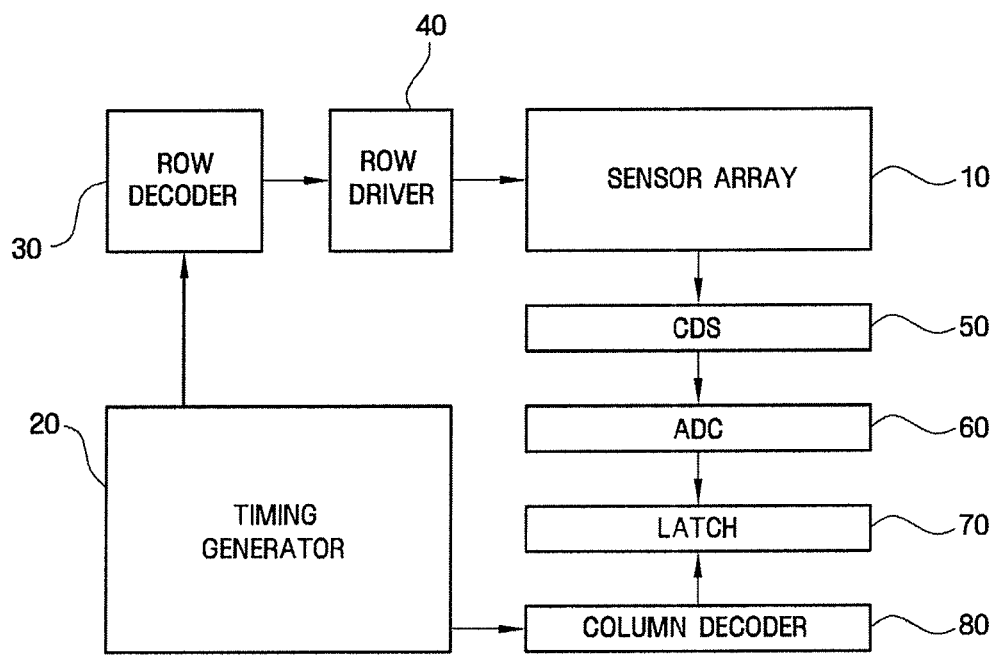
FIG. 1 is a block diagram of an image sensor in accordance with embodiments of the present inventive concepts.

Embodiments of the present inventive concepts will now be described more fully hereinafter with reference to the accompanying drawings. Inventive concepts may be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary team "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or exemplary terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Inventive concepts will be described with reference to perspective views, cross-sectional views, and/or plan views. Thus, the profile of an exemplary view may be modified according to manufacturing techniques and/or allowances. That is, the embodiments are not intended to limit the scope of the present inventive concepts but cover all changes and modifications that can be caused due to a change in manufacturing process. Thus, regions shown in the drawings are illustrated in schematic form and the shapes of the regions are presented simply by way of illustration and not as a limitation.

Hereinafter, an image sensor in accordance with some embodiments of the present inventive concepts will be described with reference to the accompanying drawings.

Figure 2:
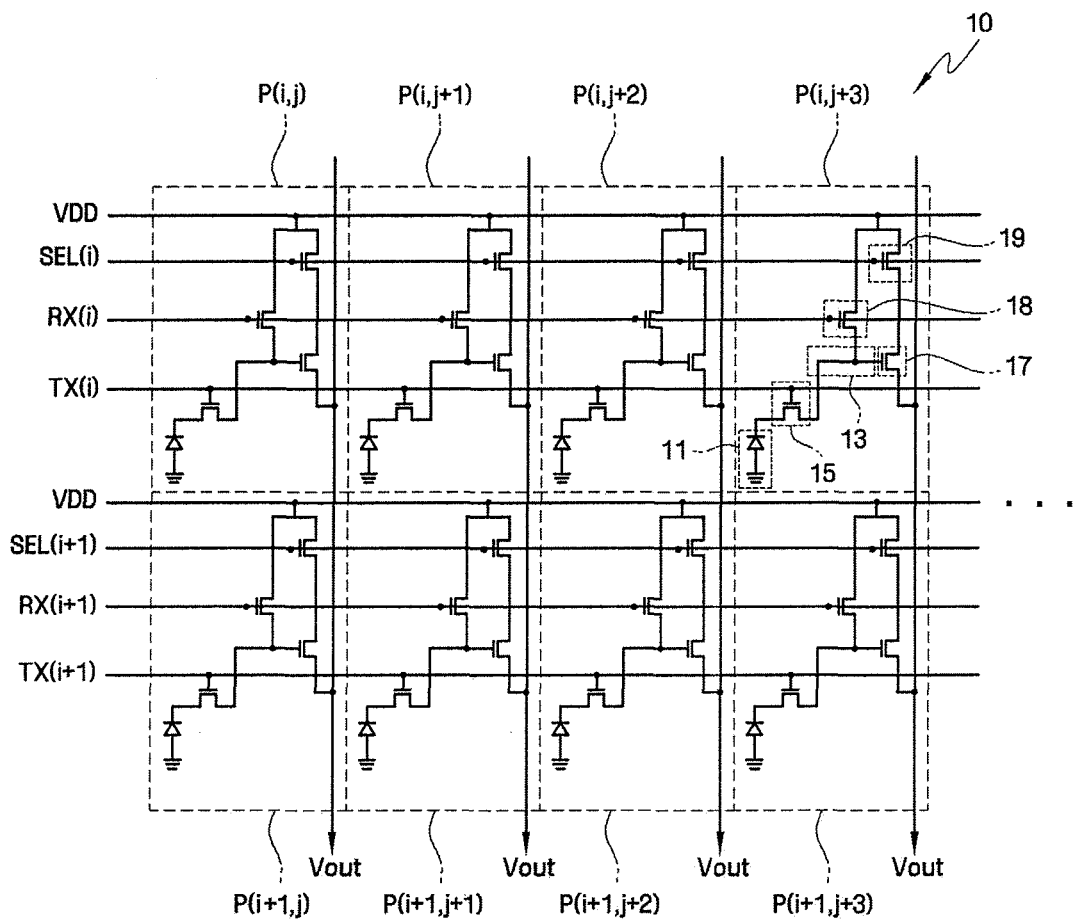
FIG. 2 is an equivalent circuit diagram of a sensor array of FIG. 1.
Figure 3:
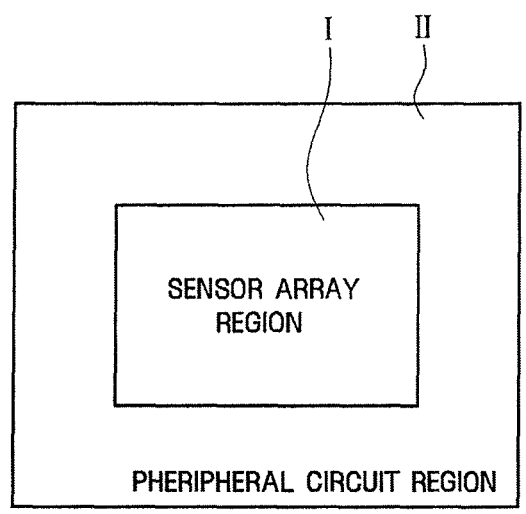
FIG. 3 is a conceptual diagram for explaining the image sensor in accordance with the embodiments of the present inventive concepts.

FIG. 1 is a block diagram of an image sensor in accordance with the embodiments of the present inventive concepts. FIG. 2 is an equivalent circuit diagram of a sensor array of FIG. 1. FIG. 3 is a conceptual diagram for explaining the image sensor in accordance with the embodiments of the present inventive concepts.

Referring to FIG. 1, an image sensor in accordance with embodiments of the present inventive concepts comprises a sensor array 10 formed by arranging pixels including photoelectric conversion elements in a two-dimensional manner, a timing generator 20, a row decoder 30, a row driver 40, a correlated double sampler (CDS) 50, an analog-to-digital converter (ADC) 60, a latch 70, a column decoder 80 and the like.

The sensor array 10 includes a plurality of unit pixels arranged in a two-dimensional configuration. The unit pixels operate to convert an optical image into electrical output signals. The sensor array 10 is driven by receiving a plurality of drive signals such as a row select signal, a reset signal and a charge transfer signal from the row driver 40. Further, the converted electrical output signals are provided to the correlated double sampler 50 through vertical signal lines.

The timing generator 20 provides a timing signal and a control signal to the row decoder 30 and the column decoder 80.

The row driver 40 provides, to the sensor array 10, a plurality of drive signals for driving a plurality of unit pixels based on the decoding results in the row decoder 30. Generally, in a case where the unit pixels are arranged in a matrix form, the drive signal is provided for each row.

The correlated double sampler 50 receives the output signals generated in the sensor array 10 through the vertical signal lines, and holds and samples the signals. That is, the correlated double sampler 50 double-samples a specific noise level and a signal level according to each of the output signals, and outputs a difference level corresponding to a difference between the noise level and the signal level.

The analog-to-digital converter 60 converts an analog signal corresponding to the difference level into a digital signal, and outputs the digital signal.

The latch 70 latches the digital signals, and the latched signals are sequentially output to an image signal processor (not shown) according to the decoding results of the column decoder 80.

Referring to FIG. 2, pixels P are arranged in the form of a two-dimensional matrix of rows and columns to constitute the sensor array 10. Each of the pixels P includes a photoelectric conversion element 11, a floating diffusion region 13, a charge transfer element 15, a drive element 17, a reset element 18, and a select element 19. The functions thereof will be described using pixels P(i, j), P(i, j+1), P(i, j+2), P(i, j+3), . . . located in the i-th row as an example.

The photoelectric conversion element 11 absorbs incident light, and accumulates the charge corresponding to the amount of light. In various embodiments, the photoelectric conversion element 11 may comprise a photodiode, a phototransistor, a photogate, a pinned photodiode, or a combination thereof, but it is not limited thereto. The photodiode is illustrated as an example in FIG. 2.

The photoelectric conversion element 11 is coupled to the charge transfer element 15 which transfers the accumulated charge to the floating diffusion region 13. Since the floating diffusion region (FD) 13, which converts the charge into a voltage, has a parasitic capacitance, the charge is cumulatively stored in the floating diffusion region 13.

The drive element 17 amplifies a change in the electrical potential of the floating diffusion region 13 which receives the accumulated charge from the photoelectric conversion element 11, and outputs it to an output line Vout. In FIG. 2, a source follower amplifier is illustrated as an example of the drive element 17. Embodiments are not limited thereto.

The reset element 18 periodically resets the floating diffusion region 13. In some embodiments, the reset element 18 may be formed of a MOS transistor that is driven by a bias provided by a reset line RX(i) which applies a predetermined bias (i.e., reset signal). When the reset element 18 is turned on by the bias provided by the reset line RX(i), a predetermined electrical potential, e.g., a source voltage VDD, which is provided to the drain of the reset element 18, is transferred to the floating diffusion region 13.

The select element 19 operates to select the pixels P to be read on a row-by-row basis. In some embodiments, the select element 19 may comprise a MOS transistor that is driven by a bias (i.e., row select signal) provided by a row select line SEL(i). When the select element 19 is turned on by the bias provided by the row select line SEL(i), a predetermined electrical potential, e.g., a source voltage VDD, which is provided to the drain of the select element 19 is transferred to a drain region of the drive element 17.

A transmission line TX(i) which applies a bias to the charge transfer element 15, the reset line RX(i) which applies a bias to the reset element 18, and the row select line SEL(i) which applies a bias to the select element 19 may be arranged to extend substantially parallel to one another in a row direction.

Referring to FIG. 3, a peripheral circuit region II may be, e.g., a region where the correlated double sampler 50, the analog-to-digital converter 60 and the latch 70 of FIG. 1 and the like are formed. A sensor array area I may be, e.g., a region where the sensor array 10 of FIG. 1 is formed. Further, as illustrated, the peripheral circuit region II may be formed to surround the sensor array area I, but embodiments of the present inventive concepts are not limited thereto.

Figure 4:
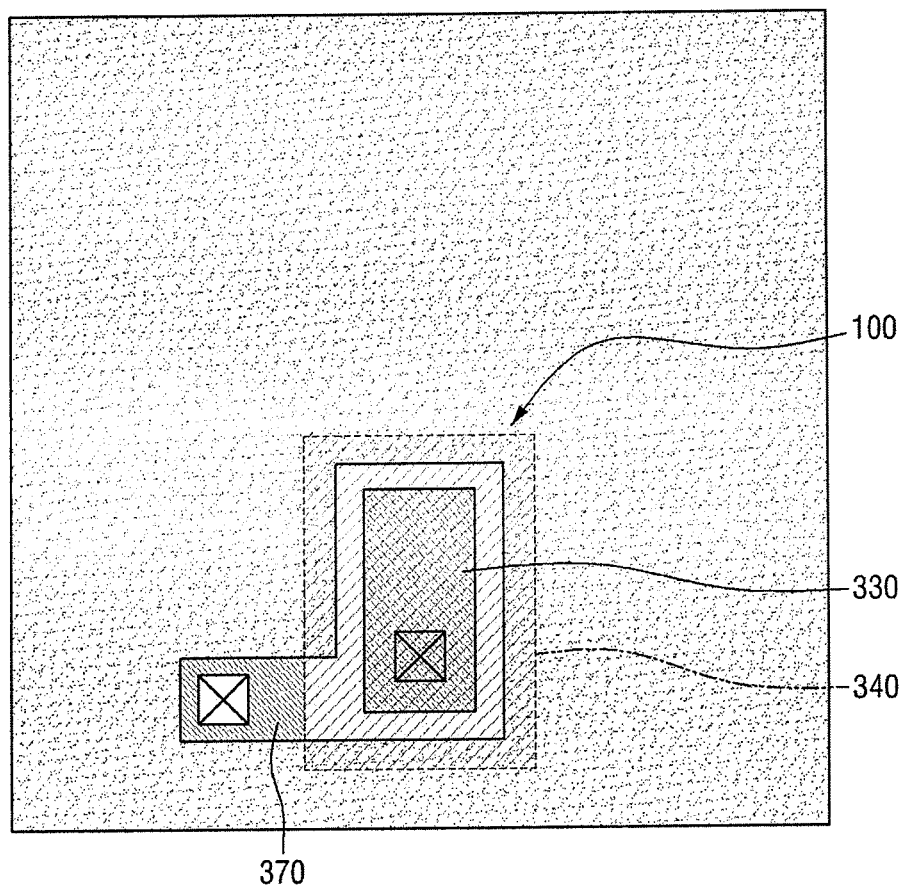
FIG. 4 is a layout diagram of a conventional image sensor.
Figure 5:
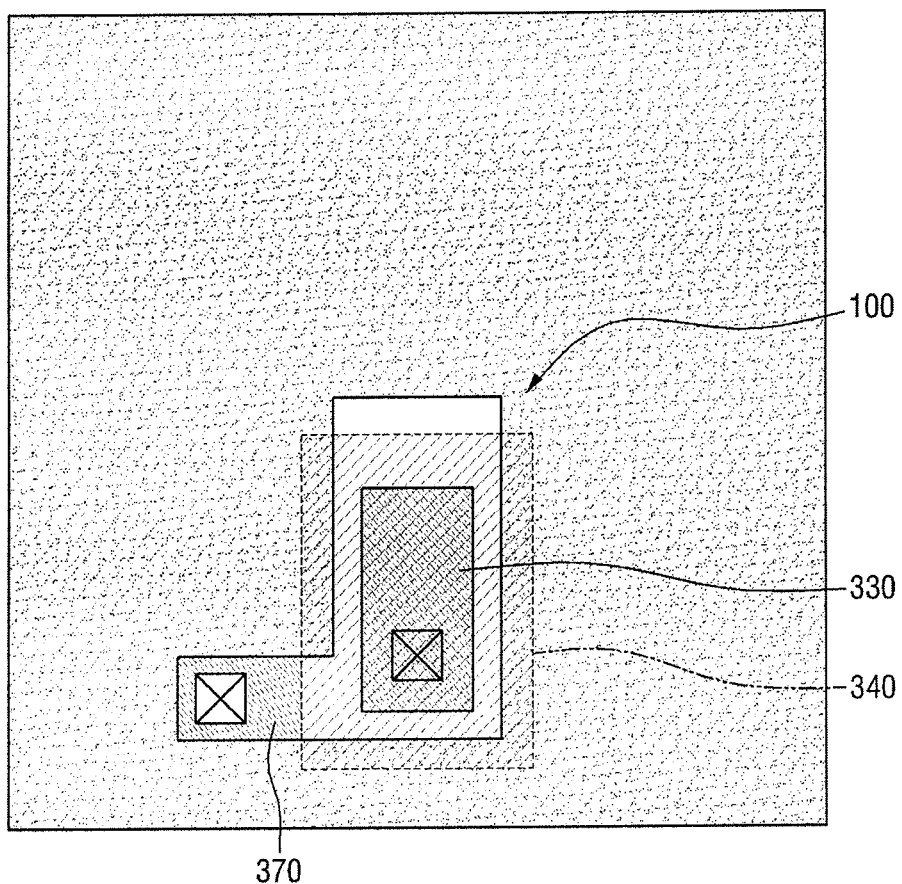
FIG. 5 is a layout diagram of an image sensor in accordance with embodiments of the present inventive concepts.
Figure 6:
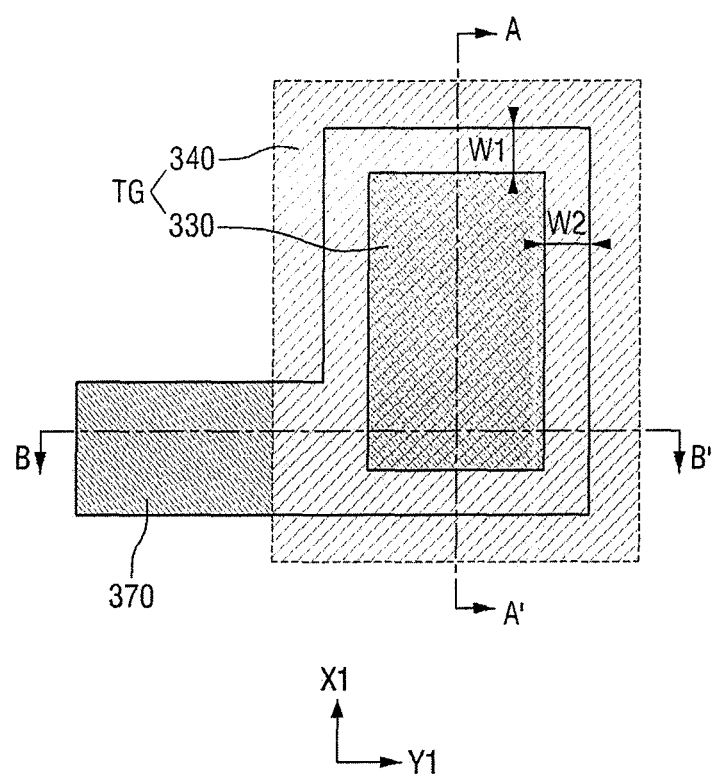
FIG. 6 depicts a portion of the image sensor of FIG. 4.
Figure 7:
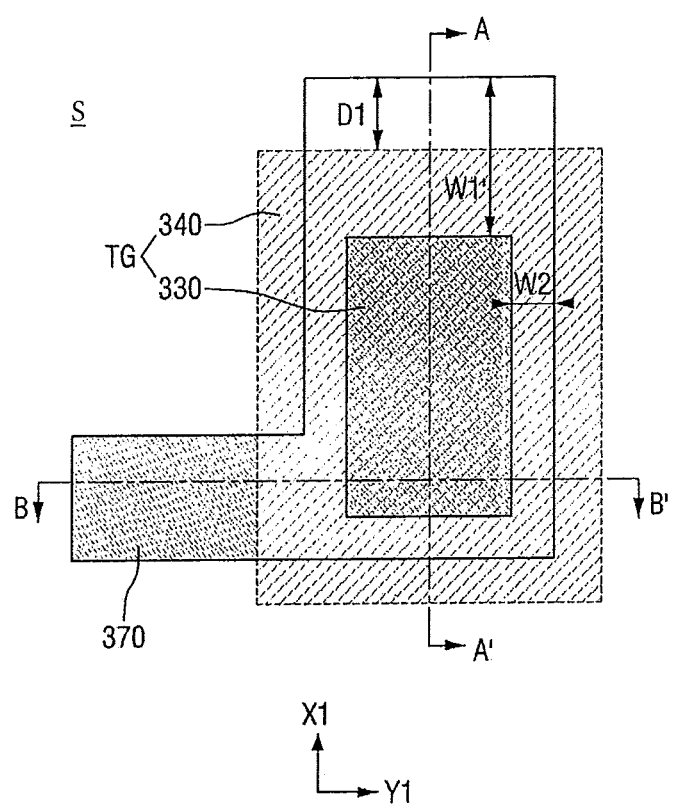
FIG. 7 depicts a portion of the image sensor of FIG. 5.
Figure 8:
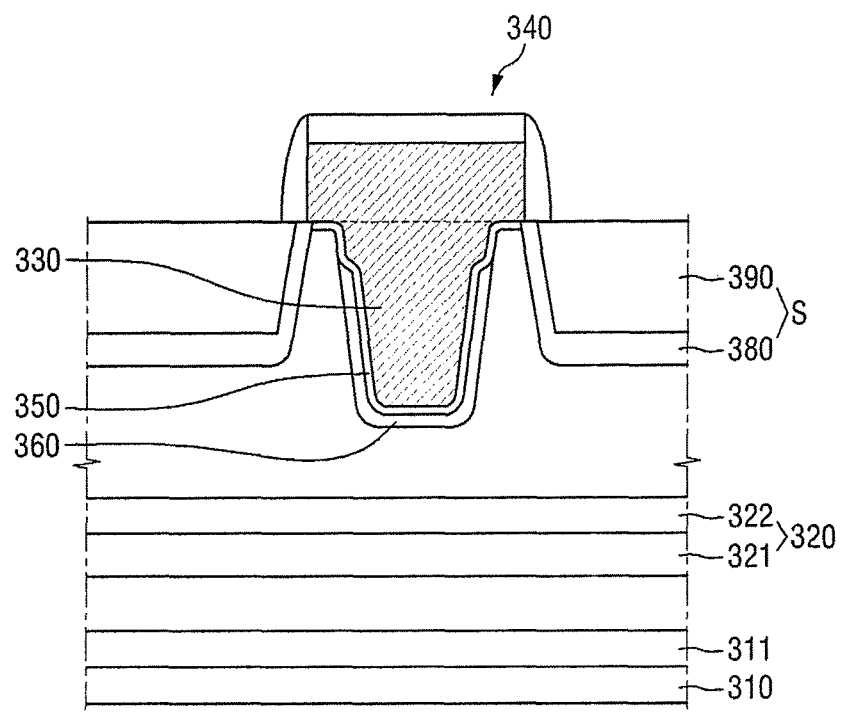
FIG. 8 is a cross-sectional view taken along line A-A' of FIG. 6.
Figure 9:
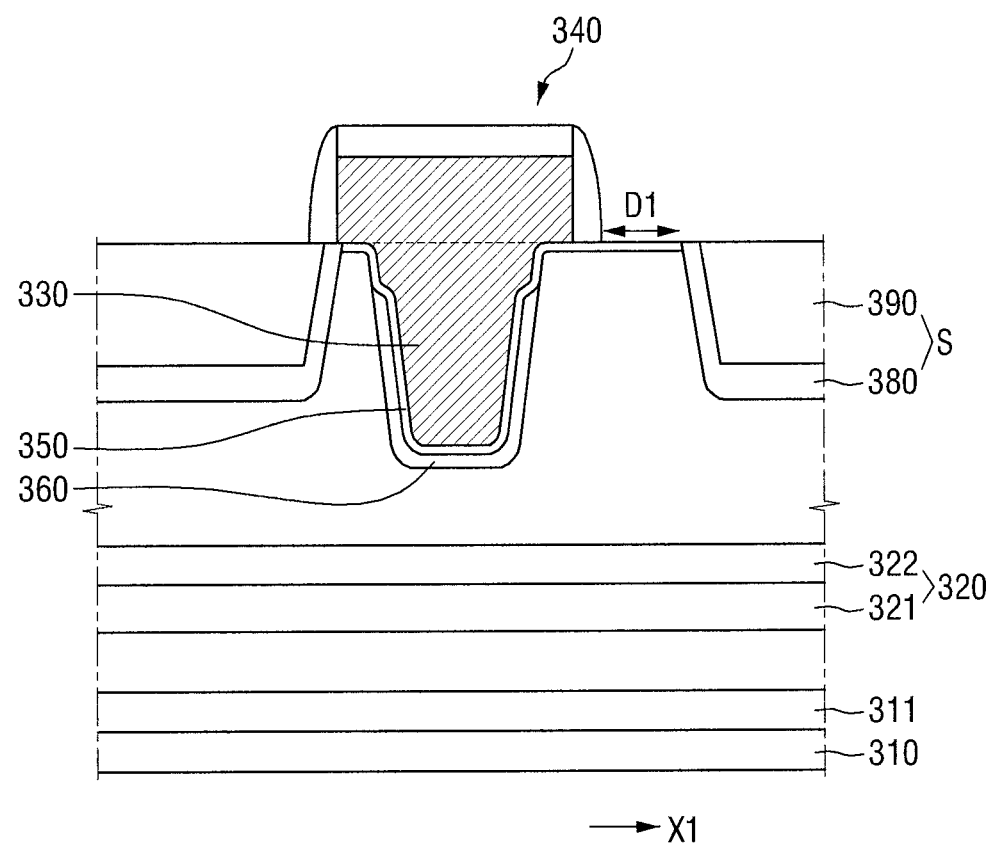
FIG. 9 is a cross-sectional view taken along line A-A' of FIG. 7.
Figure 10:
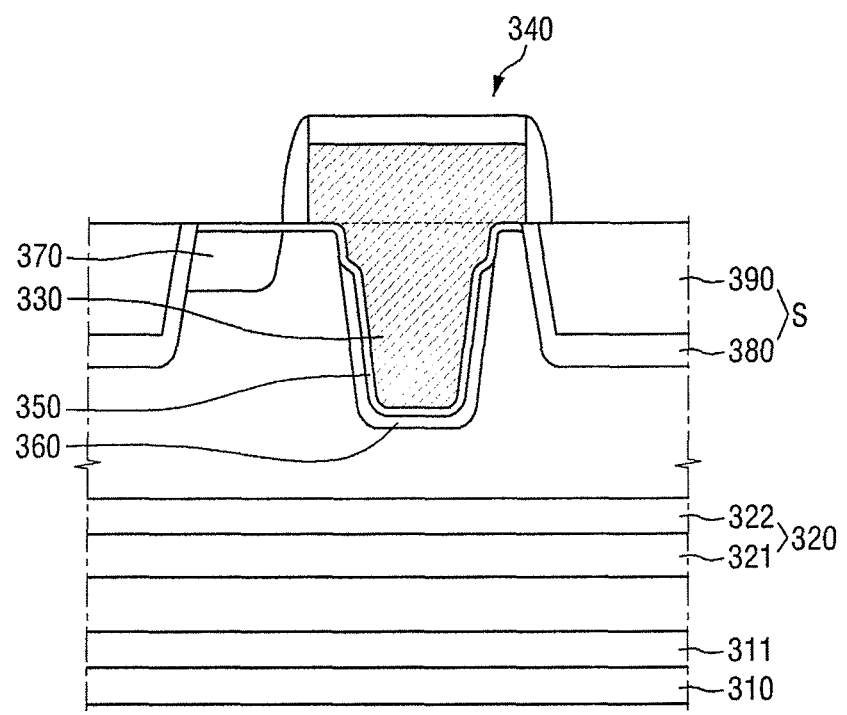
FIG. 10 is a cross-sectional view taken along line B-B' of FIG. 7.

FIG. 4 is a layout diagram of a conventional image sensor. FIG. 5 is a layout diagram of an image sensor in accordance with an embodiment of the present inventive concepts. FIG. 6 shows a portion of the image sensor of FIG. 4. FIG. 7 shows a portion of the image sensor of FIG. 5. FIG. 8 is a cross-sectional view taken along line A-A' of FIG. 6. FIG. 9 is a cross-sectional view taken along line A-A' of FIG. 7. FIG. 10 is a cross-sectional view taken along line B-B' of FIG. 7.

Referring to FIGS. 4 to 7, the image sensor in accordance with the embodiment of the present inventive concepts includes a first active region 100.

The first active region 100 may be formed in an L shape on a substrate 310. At least one driving transistor may be formed in the first active region 100. The driving transistor may be, for example, the drive element 17, the reset element 18, the select element 19 or the like (see FIG. 2).

Although not shown in FIGS. 4 to 7, the image sensor in accordance with the embodiments of the present inventive concepts may further include another active region (not shown) other than the first active region 100. At least one driving transistor may be further formed in another active region. The driving transistor may take the form of, for example, the drive element 17, the reset element 18, the select element 19 or the like (see FIG. 2).

Comparing FIGS. 4 and 5, unlike the conventional image sensor, in the image sensor in accordance with the embodiment of the present inventive concepts, a portion of the first active region 100 may be extended. That is, the first active region 100 defined by an element isolation region is extended, and an element isolation region formed around a transfer gate TG is shifted in position. Accordingly, the electrostatic potential characteristics of the image sensor can be improved, and an image lag can be reduced. For example, in the case of an image sensor having a conventional structure, the value of electrostatic potential is about 1.6 eV. However, in the case of an image sensor having a structure in accordance with the embodiment of the present inventive concepts, the value of electrostatic potential is about 2.7 eV, which is increased by about 1.1 eV.

Referring to FIGS. 6 and 7, specifically, the first active region 100 may be extended in a first horizontal direction X1. In the image sensor having a conventional structure, an upper width between a first sub-gate 330 and the first active region 100 may be W1, and in the image sensor having a structure in accordance with embodiments of the present inventive concepts, an upper width between the first sub-gate 330 and the first active region 100 may be W1'. That is, in the image sensor having a structure in accordance with embodiments of the present inventive concepts, a portion of an element isolation region S may be spaced from a second sub-gate 340 by a width D1.

Referring to FIGS. 8 to 10, the image sensor in accordance with embodiments of the present inventive concepts may include the substrate 310, a deep well 311, a photoelectric conversion element 320, the first sub-gate 330, the second sub-gate 340, a floating diffusion region 370, an element isolation impurity region 380, an element isolation film 390 and the like.

The substrate 310 may comprise, for example, a first conductive type (e.g., p-type) substrate. Although not shown, an epitaxial layer may be formed on the substrate 310. The substrate 310 may comprise a silicon-on-insulator (SOI) substrate including a lower silicon substrate, a buried insulating layer formed on the lower silicon substrate, and a silicon semiconductor layer formed on the buried insulating layer. In some embodiments, the element isolation region S is formed in the substrate 310, and the active region can be defined by the element isolation region S. In the element isolation region S, in various embodiments, field oxide (FOX) or shallow trench isolation (STI) may be formed by using a local oxidation of silicon (LOCOS) method. The element isolation region S may operate to isolate unit pixels. In the substrate 310, a deep well 311 may be provided. The deep well 311 may be doped with first conductive type (e.g., p-type) impurities at a higher concentration than that of the substrate 310.

The photoelectric conversion element 320 may be formed in the substrate 310. The photoelectric conversion element 320 may comprise, for example, a phototransistor, a photogate, a photodiode, or pinned photodiode, or a combination thereof, but it is not limited thereto. As shown in FIGS. 8 to 10, a case where the photoelectric conversion element 320 is a photodiode will be described as an example. The photoelectric conversion element 320 may include a second conductive type (e.g., n-type) impurity region 321. The second conductive type (e.g., n-type) impurity region 321 may be in contact with the first conductive type (e.g., p-type) substrate to form a PN junction, thereby constituting a photodiode. Further, the photoelectric conversion element 320 may further include a first conductive type (e.g., p-type) impurity region 322 in contact with the second conductive type (e.g., n-type) impurity region 321. In some embodiments, the first conductive type (e.g., p-type) impurity region 322 may be doped with p-type impurities at a higher concentration than the first conductive type (e.g., p-type) substrate 310.

The transfer gate TG may include the first sub-gate 330 and the second sub-gate 340.

The first sub-gate 330 is formed to fill up a recessed region in the substrate 310. The recessed portion may have an inclined sidewall. The slope of the sidewall may be, for example, 82 degrees to 88 degrees relative to horizontal, but it is not limited thereto. An edge portion formed by the bottom and the sidewall of the recessed portion may be curved. Further, an upper portion of the recessed portion may be also curved. By forming the curved structure, it is possible to prevent a gate insulating film 350 from being degraded due to the propensity for electric fields to become concentrated at sharp edge portions. Accordingly, the reliability of the image sensor can be improved. The gate insulating film 350 may be formed between the first sub-gate 330 and the substrate 310.

A channel impurity region 360 is formed in the substrate 310 adjacent to the recessed portion of the first sub-gate 330. The channel impurity region 360 may be formed to surround the first sub-gate 330. The threshold voltage of a transfer transistor can be adjusted in accordance with the position and geometry of the channel impurity region 360. In some embodiments the channel impurity region 360 may be doped with first conductive type (e.g., p-type) impurities at a higher concentration than the substrate 310.

The second sub-gate 340 is formed on the first sub-gate 330 in contact with the upper surface of the substrate 310. That is, the second sub-gate 340 is formed to protrude from the substrate 310. The second sub-gate 340 may have a width that is different from that of the first sub-gate 330. In particular, the lower surface of the second sub-gate 340 may be wider than the upper surface of the first sub-gate 330.

Referring to FIG. 10, the floating diffusion region 370 is formed on the first active region 100. Specifically, the floating diffusion region 370 may be formed in the first active region 100 of the substrate 310 while being spaced from the photoelectric conversion element 320. The floating diffusion region 370 may be doped with second conductive type (e.g., n-type) impurities.

The element isolation region S is formed in the substrate 310 to be spaced from the first sub-gate 330. A portion of the element isolation region S is formed to be spaced from an area including the second sub-gate 340 in a first direction (direction X1) by a first distance D1. In some embodiments, the first distance may range from about 0.02 µm to about 0.4 µmm. In some embodiments, the element isolation region S includes the element isolation film 390 formed of an insulating material and the element isolation impurity region 380 surrounding at least a portion of the element isolation film 390. The element isolation impurity region 380 and the element isolation film 390 may be formed in the substrate 310. In other words, the element isolation region S may include the element isolation impurity region 380 and the element isolation film 390 embedded in the element isolation impurity region 380. However, in other embodiments, the element isolation region S can be formed to not include the element isolation film 390 in order to minimize the occurrence of dark spots, or, in other embodiments, the element isolation impurity region 380 may be formed in the substrate 310 and the element isolation film 390 may be formed partially or fully on the substrate 310.

The element isolation impurity region 380 may be doped with first conductive type (e.g., p-type) impurities at a higher concentration than that of the substrate 310. In some embodiments, the sidewalls of the element isolation impurity region 380 may be inclined. In some embodiments, the slope of the sidewall of the element isolation impurity region 380 may be about 82 degrees to 88 degrees; however, embodiments are not limited thereto.

In some embodiments, the element isolation film 390 may be formed by filling an insulating material in a trench formed by using, e.g., a shallow trench isolation (STI) method. The sidewalls of the element isolation film 390 may be inclined. In some embodiments, the slope of the sidewall of the element isolation film 390 may be about 82 degrees to 88 degrees. The element isolation impurity region 380 may be formed by doping first conductive type (e.g., p-type) impurity ions at a high concentration into an inner wall of the trench after forming the trench. Alternatively, without forming the trench and the element isolation film 390, it may alternatively be formed by doping first conductive type (e.g., p-type) impurity ions at a high concentration into the substrate 310. However, embodiments are not limited thereto.

Figure 11:
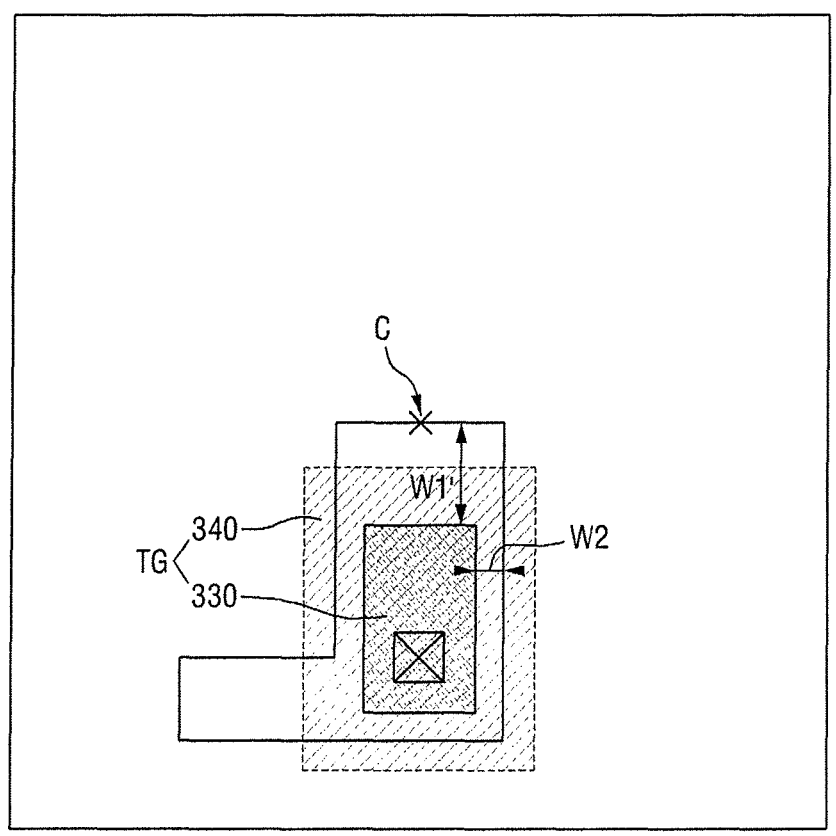
FIG. 11 depicts a portion of an image sensor in accordance with another embodiment of the present inventive concepts.

FIG. 11 shows a portion of an image sensor in accordance with another embodiment of the present inventive concepts. For simplicity of description, the description herein will be made by focusing on differences relative to other embodiments of image sensors described herein, in accordance with embodiments of the present inventive concepts.

Referring to FIG. 11, in the image sensor in accordance with another embodiment of the present inventive concepts, a portion of the element isolation region S may be extended to a central position C of a pixel area or a central position (not shown) of an area including the photoelectric conversion element 320. That is, a portion of the first active region 100 may be extended in the first direction (direction X1), and the element isolation region S formed around the transfer gate TG may be extended to the central position C of the pixel area or the central position of the area including the photoelectric conversion element 320. Accordingly, the electrostatic potential characteristics of the image sensor can be improved, and an image lag can be reduced.

Figure 12:
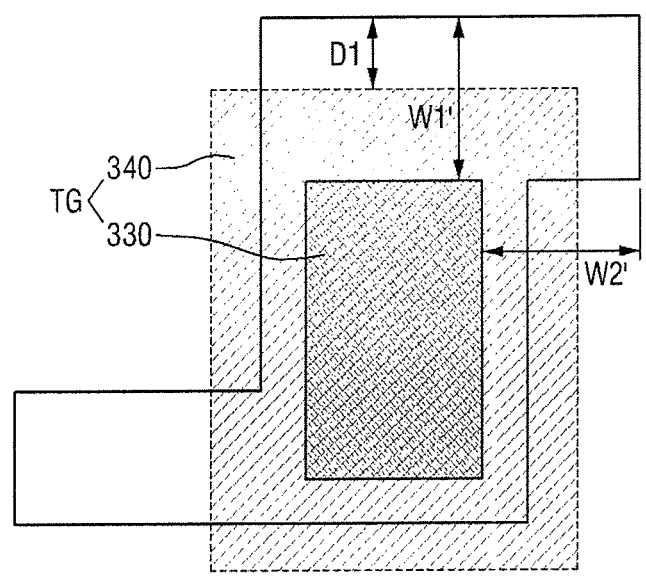
FIG. 12 depicts a portion of an image sensor in accordance with another embodiment of the present inventive concepts.
Figure 12:
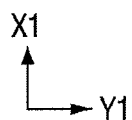

FIG. 12 shows a portion of an image sensor in accordance with still another embodiment of the present inventive concepts. For simplicity of description, the description herein will be made by focusing on differences relative to other embodiments of image sensors described herein, in accordance with embodiments of the present inventive concepts. Referring to FIG. 12, in the image sensor in accordance with embodiments of the present inventive concepts, a portion of the element isolation region S may be formed to include a second region that is further spaced by a second distance in a second direction (e.g., direction Y1 perpendicular to the direction X1) different from the first direction (direction X1). For example, the first active region 100 may be formed in a stepped shape. That is, the element isolation region formed around the transfer gate TG extends in the first direction X1 and may be further shifted in the second direction Y1. In the image sensor having the structure according to embodiments of the present inventive concepts, a width of spacing between the first sub-gate 330 and the first active region 100 can be referred to as W2. In the image sensor having the structure according to still another embodiment of the present inventive concepts, a portion of the width between the first sub-gate 330 and the first active region 100 is W2'. That is, an upper right portion of the element isolation region may be spaced from the first sub-gate 330 by W2' in the second direction Y1. For example in some embodiments, a difference between W2 and W2' may be 0.5 μm. Accordingly, the electrostatic potential characteristics of the image sensor can be improved, and an image lag can be reduced. For example, in the case of the image sensor having the structure according to the embodiment of the present inventive concepts for example according to the embodiments of FIGS. 9-11, the value of electrostatic potential is about 1.29 eV, but in the case of the image sensor having the structure according to the embodiment of FIG. 12, the value of electrostatic potential is about 1.44 eV, which is increased by about 0.15 eV.

Figure 13:
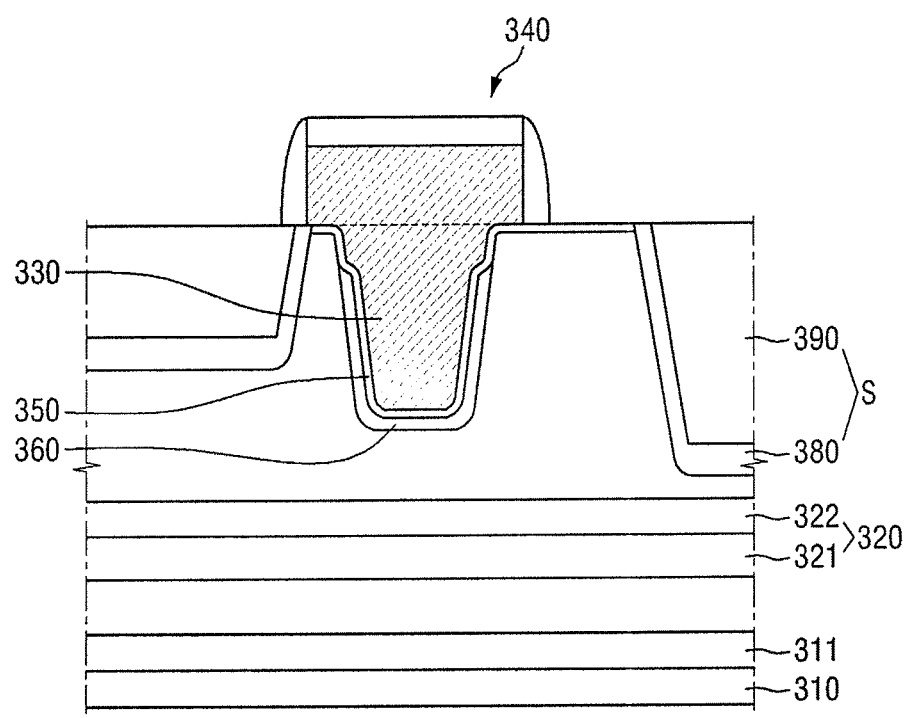
FIG. 13 depicts a cross-sectional view of an image sensor in accordance with another embodiment of the present inventive concept.

FIG. 13 shows a cross-sectional view of an image sensor in accordance with another embodiment of the present inventive concepts. For simplicity of description, the description herein will be made by focusing on differences relative to other embodiments of image sensors described herein, in accordance with embodiments of the present inventive concepts.

Referring to FIG. 13, in the image sensor in accordance with embodiments of the present inventive concepts, the element isolation region S may be formed around the first active region 100, and the element isolation region S may be formed by filling an insulating material in a trench formed by using a deep trench isolation (DTI) method.

Figure 14:
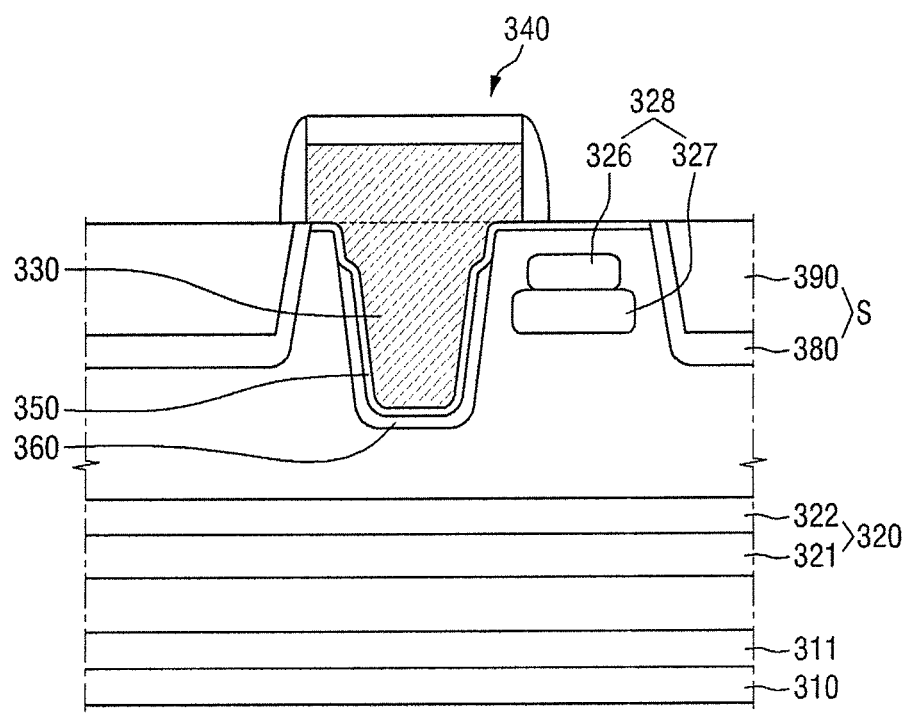
FIG. 14 depicts a cross-sectional view of an image sensor in accordance with another embodiment of the present inventive concepts.

FIG. 14 shows a cross-sectional view of an image sensor in accordance with another embodiment of the present inventive concepts. For simplicity of description, the description herein will be made by focusing on differences relative to other embodiments of image sensors described herein, in accordance with embodiments of the present inventive concepts.

Referring to FIG. 14, in the image sensor in accordance with another embodiment of the present inventive concepts, photoelectric conversion elements 320 and 328 may include a first photoelectric conversion element 320 and a second photoelectric conversion element 328, and the first photoelectric conversion element 320 may be formed in a deeper region than the second photoelectric conversion element 328. The light incident on the photoelectric conversion elements 320 and 328 does not remain at a specific depth of the photoelectric conversion elements 320 and 328. Although the intensity of light is different depending on the depth of the incident light, a portion of the light continues to progress into the substrate 310. For example, blue light having a wavelength of about 470 nm may have the highest intensity, mainly, in a portion (e.g., the second photoelectric conversion element 328) adjacent to the surface of the substrate 310. That is, charges may be generated most actively in the portion (e.g., the second photoelectric conversion element 328) adjacent to the surface of the substrate 310. A portion of the blue light may continue to progress into the substrate 310, and may be incident on the first photoelectric conversion element 320 located in a deeper region than the second photoelectric conversion element 328. In some embodiments, the second photoconversion element may include a p-type region 327 and an n-type region 328, or, alternatively, an n-type region 327 and a p-type region 328. In the first photoelectric conversion element 320, charge may be generated in an amount smaller than that in the second photoelectric conversion element 328. In the image sensor configured in this way, the fast transmission of electrical signals can be achieved, and the occurrence of an image lag or dead zone can be effectively reduced.

Figure 15:
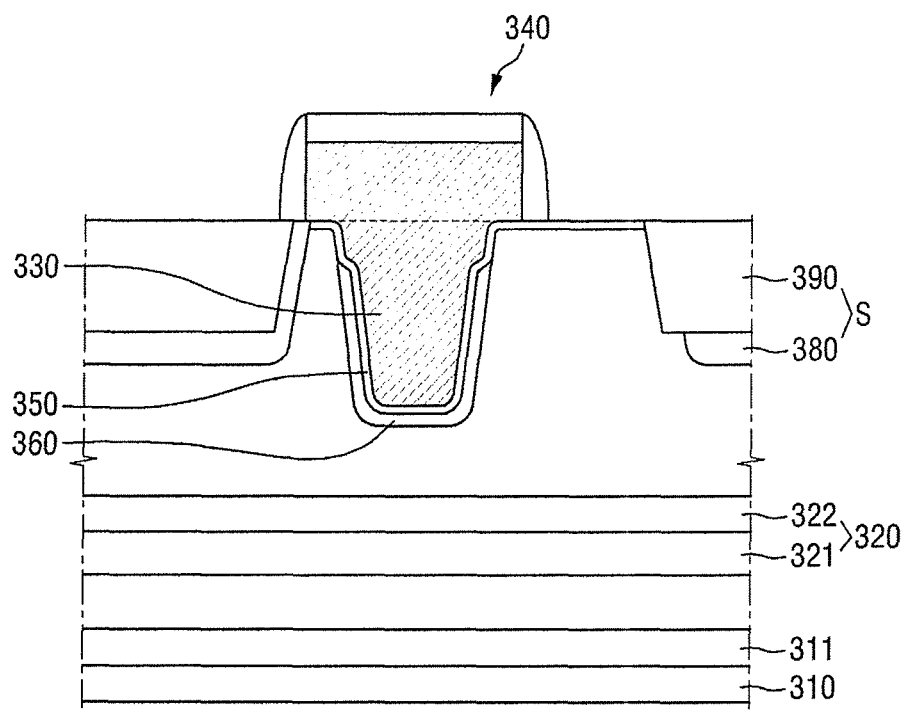
FIG. 15 depicts a cross-sectional view of an image sensor in accordance with another embodiment of the present inventive concepts.

FIG. 15 shows a cross-sectional view of an image sensor in accordance with still another embodiment of the present inventive concepts. For simplicity of description, the description herein will be made by focusing on differences relative to other embodiments of image sensors described herein, in accordance with embodiments of the present inventive concepts.

Referring to FIG. 15, in the image sensor in accordance with another embodiment of the present inventive concepts, a portion of the element isolation impurity region 380 is spaced from the area including the second sub-gate 340 by a first distance in the first direction (direction X1), and a portion of the element isolation film 390 is spaced from the area including the second sub-gate 340 by a second distance in the first direction (direction X1). The first distance may be longer than the second distance. For example, in some embodiments, the first distance may be 0.4 μm, and the second distance may be 0.02 μm.

Figure 16:
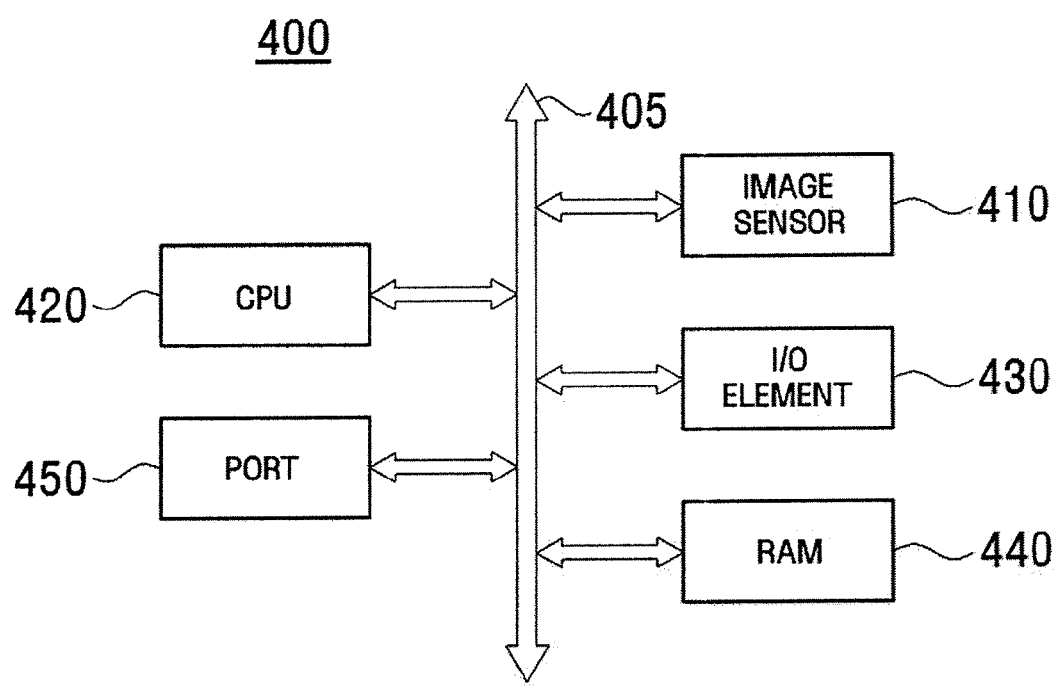
FIG. 16 depicts a computer apparatus in accordance with the present inventive concepts.
Figure 17A:
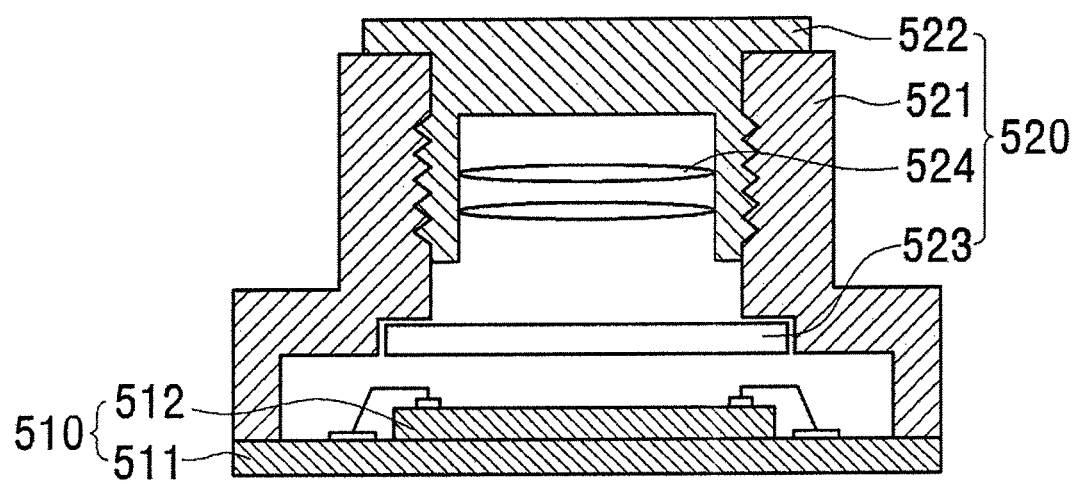
FIGS. 17A and 17B depicts a camera apparatus in accordance with the present inventive concepts.
Figure 17B:
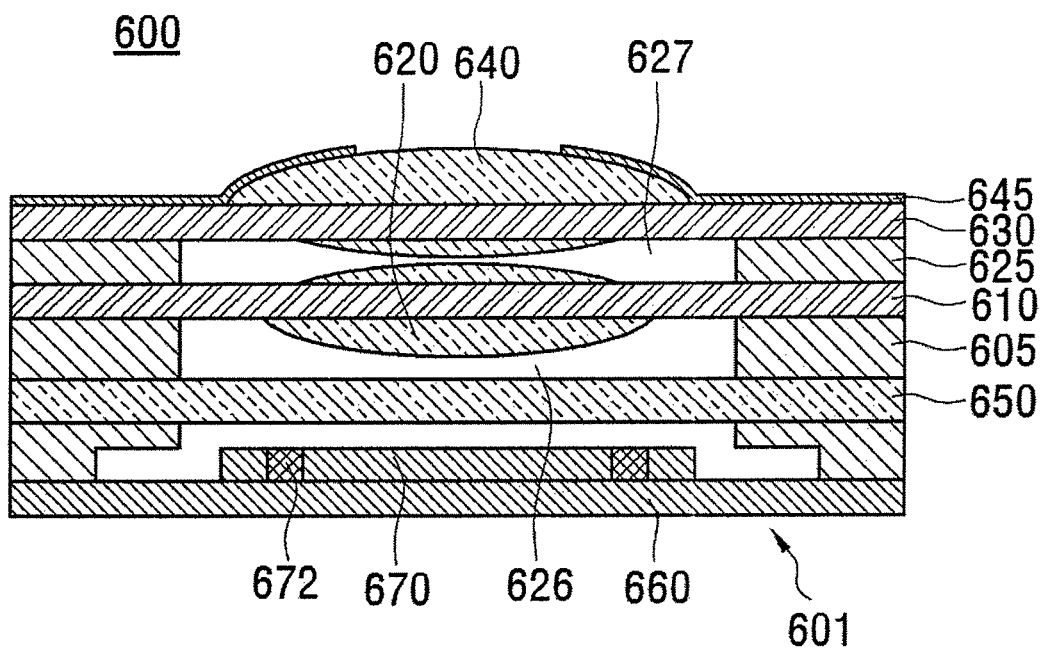
Figure 18:
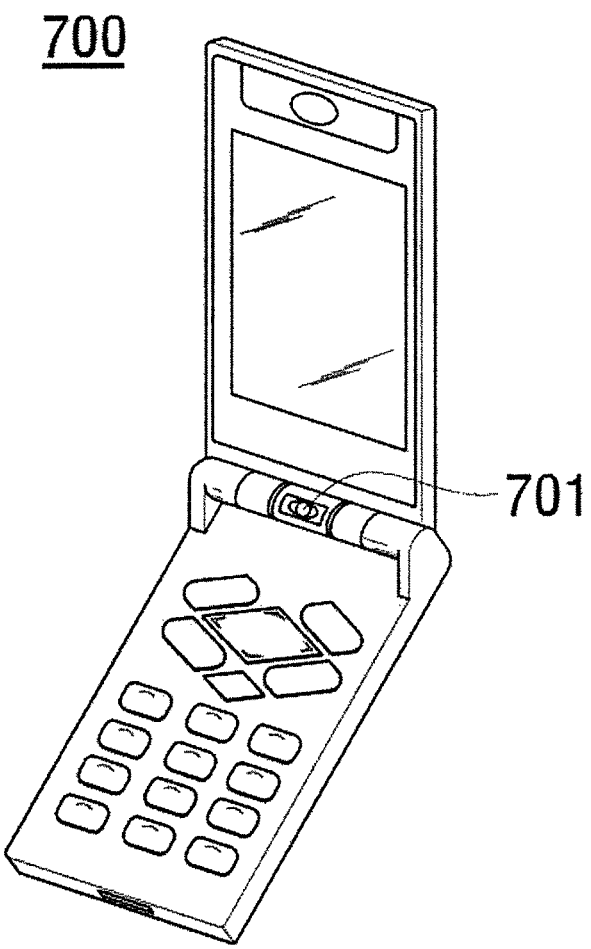
FIG. 18 depicts a mobile phone apparatus in accordance with the present inventive concepts.

Hereinafter, a processor-based apparatus including an image sensor in accordance with embodiments of the present inventive concepts will be described with reference to FIGS. 16 to 18. FIG. 16 depicts a computer apparatus. FIGS. 17A and 17B depict a camera apparatus. FIG. 18 depicts a mobile phone apparatus.

In various embodiments, image sensors in accordance with the embodiments of the present inventive concepts may be also used in other electronic apparatus (e.g., a scanner, a mechanized clock apparatus, a navigation apparatus, a video phone, a security system, an automatic focusing apparatus, a tracking apparatus, a motion monitoring apparatus, an image stabilization apparatus and the like) in addition to the above-mentioned apparatuses.

Referring to FIG. 16, a computer apparatus 400 includes a central processing unit (CPU) 420 such as a microprocessor that can communicate with an input/output (I/O) element 430 via a bus 405. An image sensor 410 can communicate with the apparatus via the bus 405 or another communication link. Further, the computer apparatus 400 may further include a RAM 440 and/or a port 450 that can communicate with the CPU 420 via the bus 405. The port 450 may be a port that can be coupled to a video card, sound card, memory card, USB device or the like, or can perform data communication with another apparatus. The image sensor 410 may be integrated together with the CPU 420, a digital signal processor (DSP), microprocessor or the like. Further, a memory may be integrated together. In some cases, it may be integrated on a separate chip from the processor.

Referring to FIG. 17A, a camera apparatus 500 includes an image sensor package 510 in which an image sensor 512 is mounted on a circuit board 511 through bonding wires. Further, a housing 520 is attached to the circuit board 511 and the housing 520 protects the circuit board 511 and the image sensor 512 from external environment.

A barrel 521 through which light passes to form an image to be captured is formed in the housing 520. A protective cover 522 may be installed at an outer end portion of the barrel 521 toward the outside, and an infrared blocking and anti-reflection filter 523 may be mounted on an inner end portion of the barrel 521. Further, a lens 524 may be mounted on the inside of the barrel 521, and the lens 524 may be moved along a thread of the barrel 521.

Referring to FIG. 17B, a camera apparatus 600 includes an image sensor package 601 using through vias 672. In the case of using the through vias 672, an image sensor 670 and a circuit board 660 may be electrically connected to each other without using wire bonding.

The camera apparatus 600 includes a first lens 620, a second lens 640, and lens components 626 and 627. Further, the camera apparatus 600 may further include support members 605 and 625, an aperture 645, transparent substrates 610 and 630, and glass 650.

Referring to FIG. 18, an image sensor 701 is provided at a predetermined position of a mobile phone apparatus 700. In various embodiments, the image sensor 701 may be provided at a position different from the position shown in FIG. 18, depending on the application of the instrument.

While the present inventive concepts have been shown and described in connection with the embodiments, it will be apparent to those skilled in the art that modifications and variations can be made without departing from the spirit and scope of the inventive concepts as defined by the appended claims.

What is claimed is:

1. An image sensor comprising:
a first sub-gate in a recessed region in a substrate;
a second sub-gate on the first sub-gate in contact with an upper surface of the substrate;
an element isolation region in the substrate spaced apart from the first sub-gate; and
a floating diffusion region positioned between the first sub-gate and the element isolation region in a second direction that lies in a plane that is parallel to the plane of the substrate on a first side of the second sub-gate,
wherein a lower surface of the second sub-gate is wider than an upper surface of the first sub-gate, and wherein a portion of the element isolation region is spaced apart from the second sub-gate on a second side of the second sub-gate by a first distance in a first direction that lies in a plane that is parallel to the plane of the substrate and is perpendicular to the second direction in a plan view, wherein the second side of the second sub-gate is different than the first side of the second sub-gate and the second side of the second sub-gate is perpendicular to the first side of the second sub-gate, and
wherein the floating diffusion region is spaced apart from the first sub-gate on the first side of the second sub-gate in the second direction different than the first direction and, in the plan view, a width of the portion of the element isolation region extending in the second direction is between a width of the second sub-gate in the second direction and a width of the first sub-gate in the second direction.

2. The image sensor of claim 1, wherein the first distance ranges between about 0.02 μm to about 0.4 μm.

3. The image sensor of claim 1, wherein a portion of the element isolation region is spaced apart from the second sub-gate by a second distance in a second direction that is different than the first direction.

4. The image sensor of claim 1, further comprising photoelectric conversion elements formed in the substrate, the photoelectric conversion elements being spaced apart from the floating diffusion region.

5. An image sensor comprising:
a first sub-gate in a recessed region of a substrate;
a second sub-gate on the first sub-gate;
an element isolation region in the substrate, a portion of the element isolation region being spaced apart from the first sub-gate in a first horizontal direction;
an active region positioned between the element isolation region and the first sub-gate; and
a floating diffusion region positioned between the first sub-gate and the element isolation region in a second direction that lies in a plane that is parallel to the plane of the substrate on a first side of the second sub-gate,
wherein a lower surface of the second sub-gate is wider than an upper surface of the first sub-gate, and wherein a portion of the element isolation region is spaced apart from the second sub-gate on a second side of the second sub-gate in the first direction, the active region extending in the first horizontal direction beyond the second sub-gate, and
wherein the floating diffusion region is spaced apart from the first sub-gate on the first side of the second sub-gate in the second direction different than the first horizontal direction that lies in a plane that is parallel to the plane of the substrate and is perpendicular to the second direction in a plan view, wherein the second side of the second sub-gate is different than the first side of the second sub-gate and the second side of the second sub-gate is perpendicular to the first side of the second sub-gate, and wherein, in the plan view, a width of the portion of the element isolation region in the second direction is between a width of the second sub-gate in the second direction and a width of the first sub-gate in the second direction.

6. The image sensor of claim 5 wherein the portion of the element isolation region is spaced apart from the second sub-gate in the first direction by a first distance that ranges between about 0.02 μm to about 0.4 μm.

7. The image sensor of claim 5, wherein the second sub gate contacts an upper surface of the substrate.

8. The image sensor of claim 4, wherein the second sub-gate contacts an upper surface of the substrate.

\* \* \* \* \*